(12) United States Patent
Chen et al.

(10) Patent No.: US 9,020,086 B2
(45) Date of Patent: Apr. 28, 2015

(54) CLOCK DATA RECOVERY CIRCUIT MODULE AND METHOD FOR GENERATING DATA RECOVERY CLOCK

(71) Applicant: Phison Electronics Corp., Miaoli (TW)

(72) Inventors: Chih-Ming Chen, Hsinchu County (TW); An-Chung Chen, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/851,963

(22) Filed: Mar. 28, 2013

(65) Prior Publication Data

US 2014/0219406 A1    Aug. 7, 2014

(30) Foreign Application Priority Data

Feb. 7, 2013  (TW) .............................. 102104955 A

(51) Int. Cl.
*H04L 7/00* (2006.01)
*H04L 7/033* (2006.01)

(52) U.S. Cl.
CPC ...................................... *H04L 7/033* (2013.01)

(58) Field of Classification Search
None
See application file for complete search history.

(56) References Cited

U.S. PATENT DOCUMENTS

| 8,098,788 | B1* | 1/2012 | Oner et al. ..................... 375/376 |
| 2005/0238129 | A1 | 10/2005 | Ishida et al. |
| 2012/0139593 | A1* | 6/2012 | Saito ............................. 327/156 |

FOREIGN PATENT DOCUMENTS

| TW | 201112715 | 4/2011 |
| TW | 201201516 | 1/2012 |

OTHER PUBLICATIONS

"Office Action of Taiwan Counterpart Application", issued on Sep. 30, 2014, p. 1-p. 7.

* cited by examiner

*Primary Examiner* — Adolf Dsouza
(74) *Attorney, Agent, or Firm* — Jianq Chyun IP Office

(57) ABSTRACT

A clock data recovery circuit module including a clock recovery circuit, a frequency comparison circuit and a signal detecting circuit is provided. The clock recovery circuit is configured to output a data recovery stream and a data recovery clock based on an input signal and a clock signal. The frequency comparison circuit is coupled to the clock recovery circuit. The frequency comparison circuit is configured to compare a frequency difference between the data recovery clock and the clock signal to adjust the frequency of the clock signal based on a comparison result. The signal detecting circuit is coupled to the frequency comparison circuit. The signal detecting circuit is configured to receive and detect the input signal, and the signal detecting circuit determines whether to enable the frequency comparison circuit according to the detection result. Furthermore, a method for generating a data recovery clock is also provided.

15 Claims, 6 Drawing Sheets

CLOCK DATA RECOVERY CIRCUIT MODULE AND METHOD FOR GENERATING DATA RECOVERY CLOCK

CROSS-REFERENCE TO RELATED APPLICATION

This application claims the priority benefit of Taiwan application serial no. 102104955, filed on Feb. 7, 2013. The entirety of the above-mentioned patent application is hereby incorporated by reference herein and made a part of this specification.

BACKGROUND

1. Technical Field

The disclosure relates to a data processing circuit and a signal generation method. Particularly, the disclosure relates to a clock data recovery circuit module and a method for generating data recovery clock.

2. Related Art

Generally, a clock data recovery circuit is configured at a signal receiving end of a data transmission interface to recover a received input signal according to a data recovery clock, so as to generate a retimed data stream. In some specific specifications, to ensure accuracy of data recovered by the clock data recovery circuit, jitter of the retimed data stream cannot be too large. Therefore, at the signal receiving end, an oscillator used in collaboration with a phase-locked loop is generally a crystal oscillator, so as to satisfy the demand for accuracy. An error between a frequency of a reference clock generated by the crystal oscillator and a frequency of the input signal has to be within a certain range. Taking a universal serial bus 3.0 (USB 3.0) specification as an example, the error between the frequency of the reference clock and the frequency of the input signal has to be smaller than 300 ppm (parts per million). Although the commercial crystal oscillator can generate the clock signal with the frequency error lower than ±100 ppm to serve as an ideal clock signal source, the price of the crystal oscillator is expansive, and the crystal oscillator occupies a larger circuit board space.

In order to save the cost and the circuit board space, according to a conventional technique, a high accuracy reference clock is provided to the phase-locked loop according to a method of auto-tracking data recovery clock frequency. However, according to such method, in a process that the USB establishes a communication link, or under a low power mode operation, if the data recovery clock is continuously tracked, accuracy of the frequency of the reference clock is decreased.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The disclosure is directed to a clock data recovery circuit module, which is capable of dynamically determining whether to perform frequency tracking.

The disclosure is directed to a method for generating a data recovery clock, which is capable of determining whether to generate the data recovery clock according to an input signal.

The disclosure provides a clock data recovery circuit module including a clock data recovery circuit, a frequency comparison circuit and a signal detection circuit. The clock data recovery circuit is configured to output a data recovery stream and a data recovery clock based on an input signal and a clock signal. The frequency comparison circuit is coupled to the clock data recovery circuit. The frequency comparison circuit is configured to compare a frequency difference between the data recovery clock and the clock signal to adjust a frequency of the clock signal based on a comparison result. The signal detection circuit is coupled to the frequency comparison circuit. The signal detection circuit is configured to receive and detect the input signal, and the signal detection circuit determines whether to enable the frequency comparison circuit according to a detection result.

The disclosure provides a method for generating a data recovery clock, which includes following steps. An input signal is detected, and it is determined whether to compare a frequency difference between a data recovery clock and a clock signal according to a detection result. The frequency difference between the data recovery clock and the clock signal is compared. A frequency of the clock signal is adjusted according to a comparison result between the data recovery clock and the clock signal.

According to the above descriptions, in the disclosure, the signal detection circuit determines not to activate or activate the frequency comparison circuit according to whether a target signal of the input signal is detected, so as to dynamically determine whether or not to perform the frequency tracking operation.

These and other exemplary embodiments, features, aspects, and advantages of the invention will be described and become more apparent from the detailed description of exemplary embodiments when read in conjunction with accompanying drawings.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
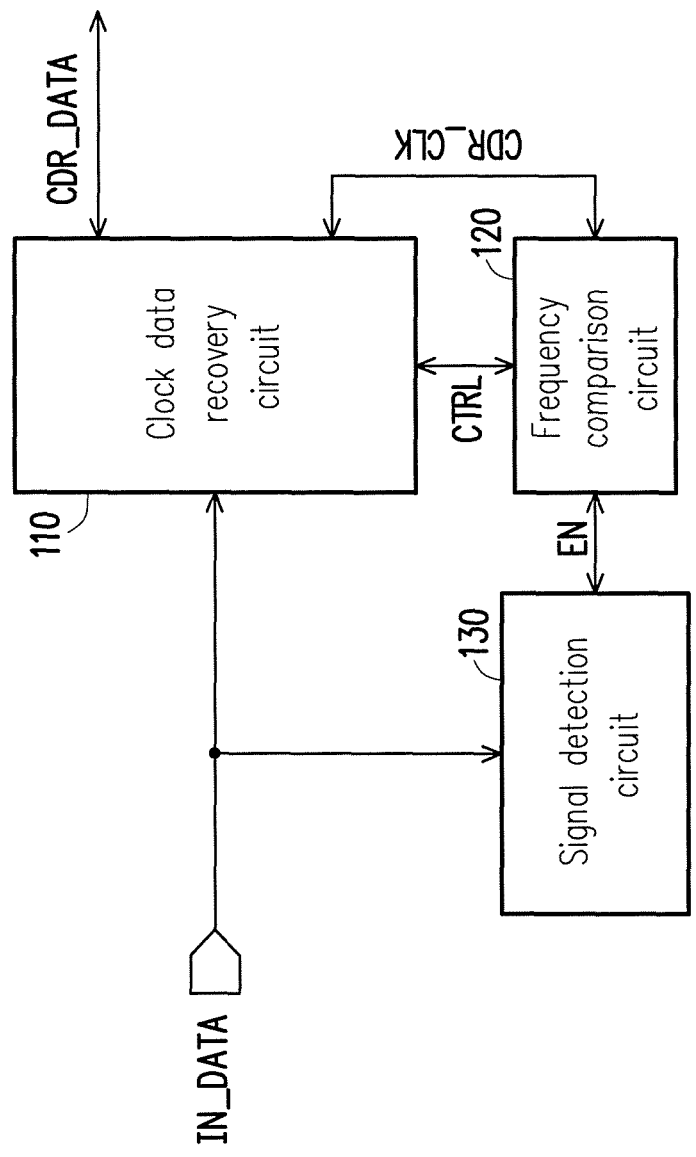
FIG. 1A is a schematic block diagram of a clock data recovery circuit module according to an exemplary embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of embodiments are provided below to describe the disclosure, though the disclosure is not limited to the provided embodiments, and the embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

Figure 1B:
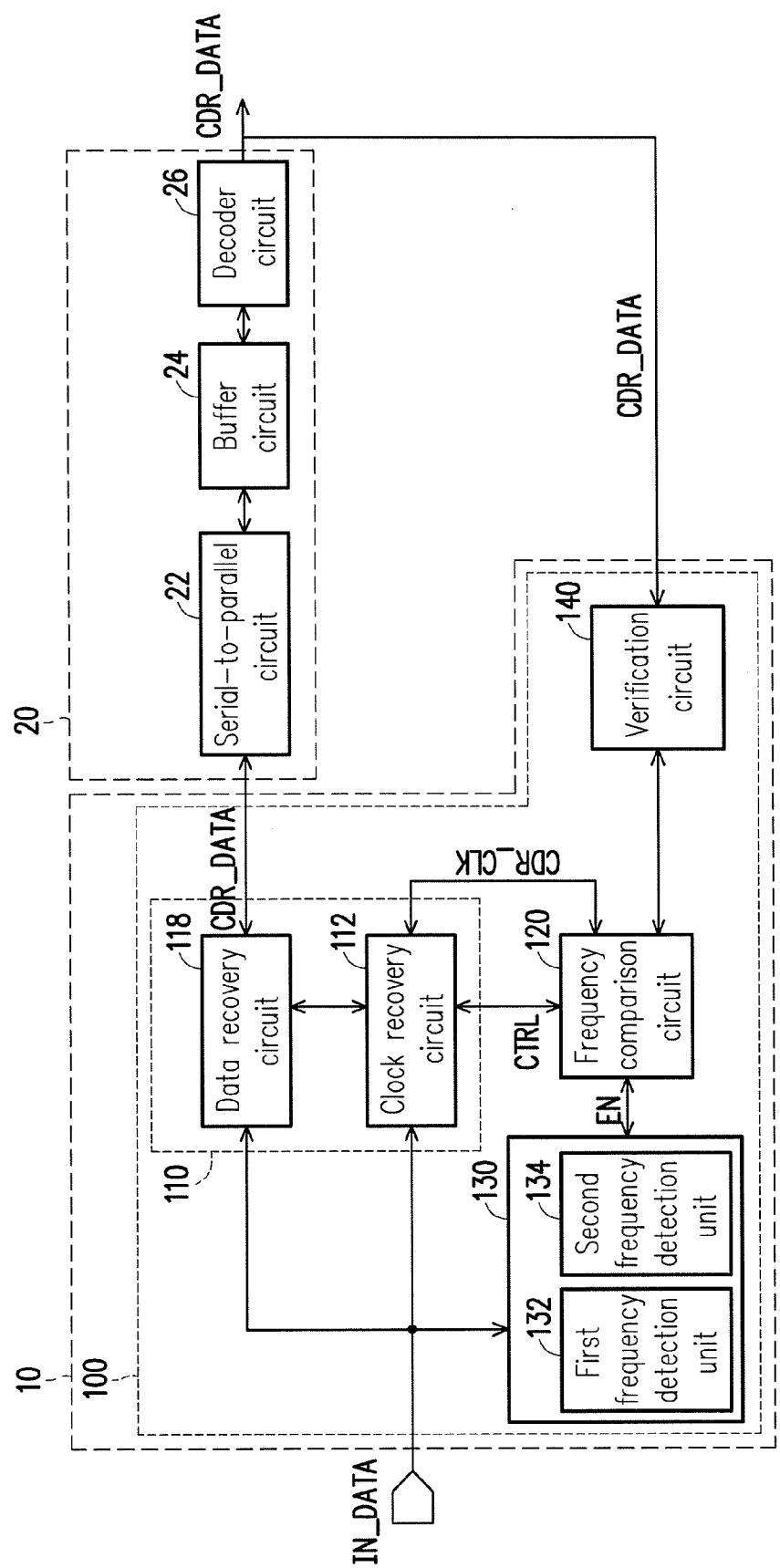
FIG. 1B is a schematic block diagram of a signal receiving end of a memory storage device according to an exemplary embodiment of the disclosure.

Referring to FIG. 1A and FIG. 1B, FIG. 1A is a schematic block diagram of a clock data recovery circuit module according to an exemplary embodiment of the disclosure, FIG. 1B is a schematic block diagram of a signal receiving end of a memory storage device according to an exemplary embodiment of the disclosure. The circuit structure of the signal receiving end of the present exemplary embodiment includes a data receiving block 10 and a data processing block 20. Generally, when the memory storage unit receives an input signal IN_DATA from a host system or other device through a data transmission interface, the memory storage device generally performs data synchronization on the input signal IN_DATA through the data receiving block 10, so as to synchronize a data signal carried by the input signal IN_DATA with an operation clock of the signal receiving end in order to avoid error generated when the post data processing block 20 processes data.

In the present exemplary embodiment, the data receiving block 10 includes a clock data recovery circuit module 100, which is configured to synchronize the data signal carried by the input signal IN_DATA with an operation clock of the signal receiving end. In the present exemplary embodiment, the clock data recovery circuit module 100 includes a clock data recovery circuit 110, a frequency comparison circuit 120 and a signal detection circuit 130, as that shown in FIG. 1A. FIG. 1B further discloses a detailed implementation of various circuit blocks in internal of the clock data recovery circuit module 100 applied in the data receiving block 10. In detail, the clock data recovery circuit 110 is configured to generate a data recovery stream CDR_DATA and a data recovery clock CDR_CLK based on the input signal IN_DATA and an internal clock signal for respectively outputting to the frequency comparison circuit 120 and the data processing block 20. In the present exemplary embodiment, the clock data recovery circuit 110 includes a clock recovery circuit 112 and a data recovery circuit 118. The clock recovery circuit 112 can perform a clock recovery operation on the input signal IN_DATA to make the data recovery stream CDR_DATA and the data recovery clock CDR_CLK operating in a correct frequency.

The frequency comparison circuit 120 is coupled to the clock data recovery circuit 110. The frequency comparison circuit 120 is configured to compare a frequency difference between the data recovery stream CDR_DATA and the clock signal in internal of the clock recovery circuit 112, so as to adjust a frequency of the clock signal based on a comparison result. In this example, the clock signal is, for example, generated by a phase-locked loop (PLL) circuit block in internal of the clock recovery circuit 112, and the frequency comparison circuit 120 can control the PLL circuit block by using a control signal CTRL, so as to adjust the frequency of the generated clock signal. In another exemplary embodiment, the PLL circuit block in internal of the clock recovery circuit 112 can also be a circuit module independent to the clock data recovery circuit 110.

The signal detection circuit 130 is coupled to the frequency comparison circuit 120. The signal detection circuit 130 is configured to detect the input signal IN_DATA and determines whether to enable the frequency comparison circuit 120 to adjust the frequency of the clock signal according to a detection result. In this example, the signal detection circuit 130 disables or enables the frequency comparison circuit 120 by using a switch signal EN.

In the present exemplary embodiment, the input signal IN_DATA may mainly include data of a first frequency, data with frequency not less than a second frequency and an electrical idle state. In the present exemplary embodiment, the data with frequency not less than the second frequency serves as a target tracked by the frequency comparison circuit 120. Therefore, when the signal detection circuit 130 detects the target signal in the input signal IN_DATA, the signal detection circuit 130 enables the frequency comparison circuit 120, and the frequency comparison circuit 120 outputs the control signal CTRL to adjust the frequency of the clock signal. Comparatively, when the signal detection circuit 130 detects the data of the first frequency in the input signal IN_DATA or detects that the input signal IN_DATA is in the electrical idle state, the signal detection circuit 130 does not enable the frequency comparison circuit 120 to avoid the data of the first frequency in the input signal IN_DATA or the input signal IN_DATA in the electrical idle state serving as the target tracked by the frequency comparison circuit 120. In the present exemplary embodiment, the first frequency is smaller than the second frequency.

In the present exemplary embodiment, the signal detection circuit 130 includes a first frequency detection unit 132 and a second frequency detection unit 134 coupled to each other, and the first frequency detection unit 132 and the second frequency detection unit 134 respectively receive and detect whether the input signal IN_DATA include data of the first frequency and data with frequency not less than the second frequency. In this example, the data of the first frequency is, for example, a low frequency period signal (LFPS) of the input signal IN_DATA, and the first frequency detection unit 132 can be a low frequency squelch detector. The second frequency component is, for example, data content of the input signal IN_DATA, and serves as a target signal of frequency tracking, and the frequency thereof is generally 5 Gigahertz (GHz). Therefore, in the present exemplary embodiment, the second frequency is greater than the first frequency. The second frequency detection unit 134 can be a high frequency squelch detector, which detects whether the input signal IN_DATA includes data with frequency not less than the second frequency.

On the other hand, after the input signal IN_DATA, the data recovery stream CDR_DATA and the data recovery clock CDR_CLK are received, the data recovery circuit 118 performs the data recovery operation on the data recovery stream CDR_DATA according to the input signal IN_DATA and the data recovery clock CDR_CLK, and transmits the processed data recovery stream CDR_DATA to a serial-to-parallel circuit 22. Then, the serial-to-parallel circuit 22 outputs the data recovery stream CDR_DATA converted to the parallel format to a buffer circuit 24 for storage. Then, the data recovery stream CDR_DATA is output to a decoder circuit 26 for decoding.

In another exemplary embodiment, the frequency comparison circuit 120 can also control an access operation of the buffer circuit 24. For example, the frequency comparison circuit 120 may control the buffer circuit 24 to output the data recovery stream CDR_DATA to the decoder circuit 26 for decoding after the signal detection circuit 130 enables the frequency comparison circuit 120.

In the present exemplary embodiment, a standard of the transmission interface serving as the input/output interface of the memory storage device includes a serial advanced technology attachment (SATA) standard, an institute of electrical and electronic engineers (IEEE) 1394 standard, a peripheral component interconnect express (PCI) express standard, a universal serial bus (USB) standard, a secure digital (SD) interface standard, a memory stick (MS) interface standard, a multi media card (MMC) interface standard, a compact flash (CF) interface standard, an integrated drive electronics (IDE) standard or other suitable standards.

Figure 2:
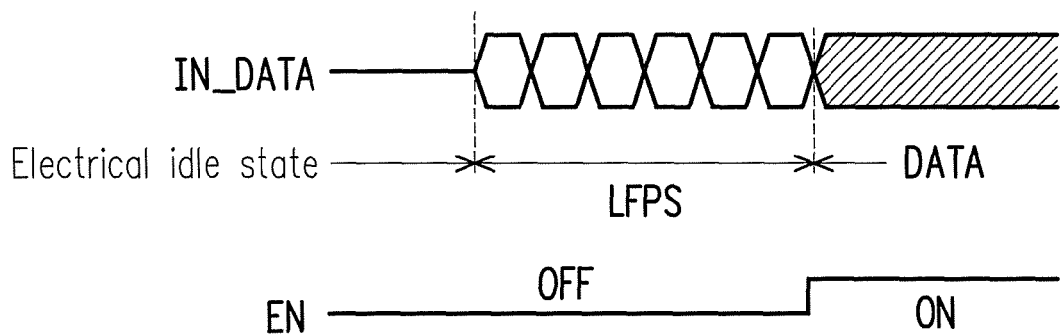
FIG. 2 and FIG. 3 are schematic waveform diagrams of input signals of different exemplary embodiments of the disclosure.
Figure 3:
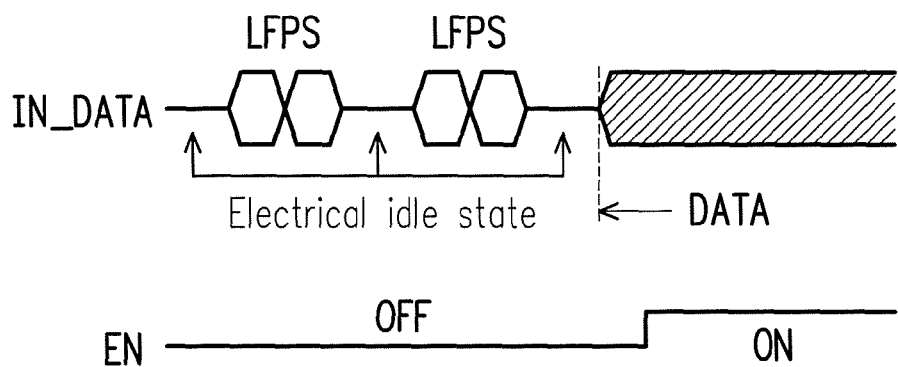

FIG. 2 and FIG. 3 are schematic waveform diagrams of input signals of different exemplary embodiments of the disclosure. Referring to FIG. 2 and FIG. 3, in the present exemplary embodiment, taking the USB 3.0 standard as an example, the input signal IN_DATA generally includes a low frequency period signal LFPS, a data signal DATA and an electrical idle state. The low frequency period signal LFPS is, for example, data with the first frequency in the input signal IN_DATA, which can be distributed in the input signal IN_DATA in a continuous or discontinuous manner as that shown in FIG. 2 and FIG. 3. The low frequency period signal LFPS is a low frequency signal, and a period thereof is about between 20 nanoseconds (ns) to 100 ns. In the present exemplary embodiment, the data signal DATA is, for example, data with the second frequency in the input signal IN_DATA, and the frequency comparison circuit 120 takes the data signal DATA as a target signal in frequency tracking, and a frequency thereof is generally 5 Gigahertz (GHz). Therefore, during a process that the memory storage device establishes the communication link or when the memory storage device is in a low power mode, the input signal IN_DATA may include the low frequency period signal LFPS and the electrical idle state. The signal detection circuit 130 of the present exemplary embodiment detects the low frequency period signal LFPS and the electrical idle state of the input signal IN_DATA, and does not enable the frequency comparison circuit 120 temporarily by using the switch signal EN, so as to maintain accuracy of frequency tracking.

In the above example, when the switch signal EN has a high level, it enables the frequency comparison circuit 120. Conversely, when the switch signal EN has a low level, it does not enable the frequency comparison circuit 120, though the disclosure is not limited thereto, and in another exemplary embodiment, the low level switch signal EN can be used to enable the frequency comparison circuit 120, and the high level switch signal EN can be used not to enable the frequency comparison circuit 120. Moreover, in the present exemplary embodiment, when the frequency comparison circuit 120 is enabled, the signal detection circuit 130 can be turned off to temporarily stop operation.

Moreover, in the present exemplary embodiment, the clock data recovery circuit module 100 further includes a verification circuit 140. The verification circuit 140 can also be used to pause the operation of the frequency comparison circuit 120. In detail, after the data decoded by the decoder circuit 26 is verified by the verification circuit 140, and the verification circuit 140 determines that error bits of the decoded data recovery stream CDR_DATA exceed a threshold, it can be determined that the data recovery stream CDR_DATA is subjected to a noise interference. Therefore, in order to prevent shifting of the originally tracked stable frequency, the verification circuit 140 pauses the frequency comparison circuit 120 to maintain the original clock signal.

Moreover, in another exemplary embodiment, the clock data recovery circuit module 100 can be applied in a wire-linked communication system, the input signal IN_DATA can be a serial data stream, and the clock data recovery circuit module 100 can receive the input signal IN_DATA through a single channel, though the invention is not limited thereto, and in another exemplary embodiment, the clock data recovery circuit module 100 can also be applied in a wireless communication system, and the input signal IN_DATA can be a parallel data stream.

Figure 4:
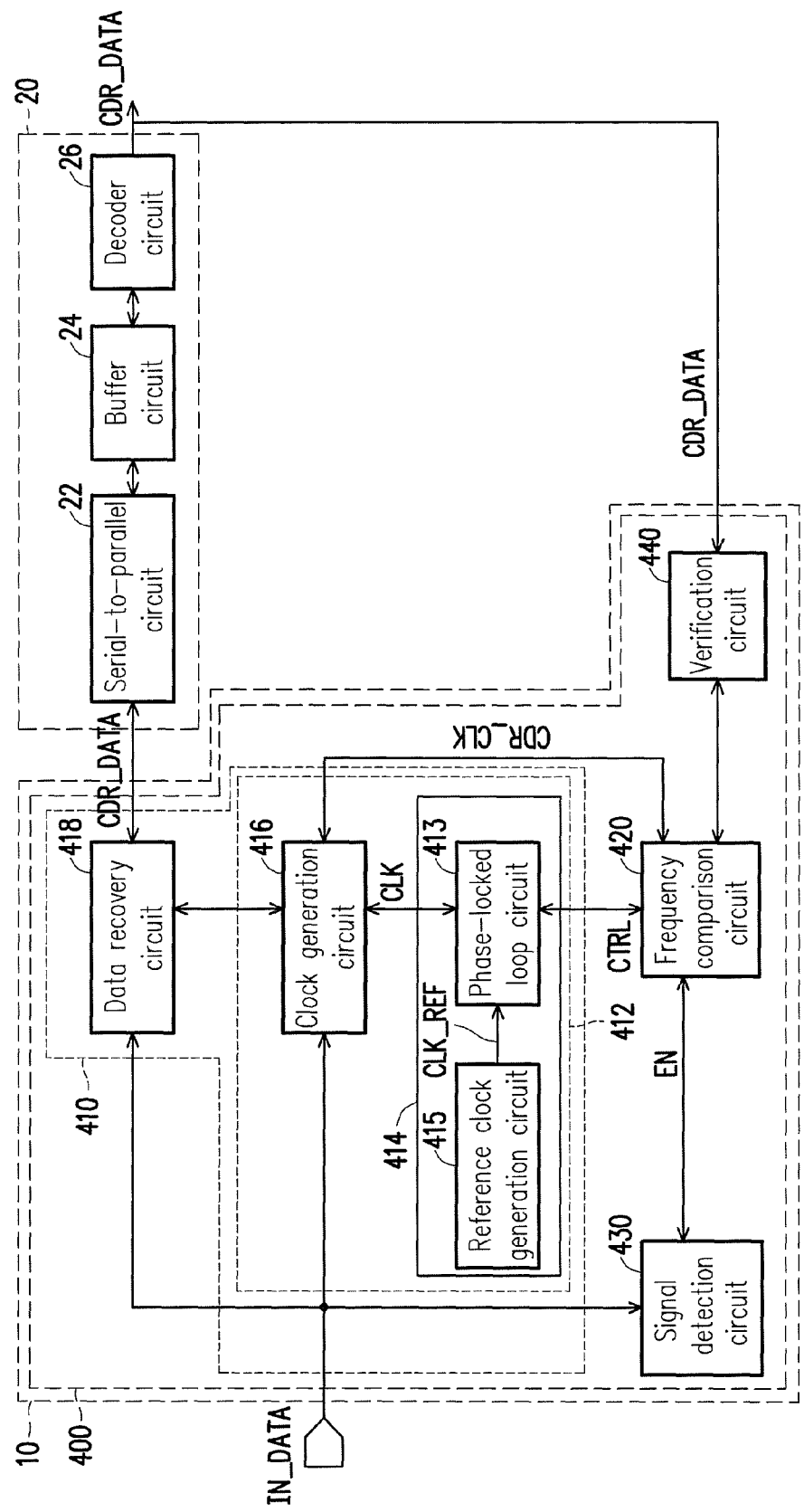
FIG. 4 is a schematic block diagram of a signal receiving end of a memory storage device according to another exemplary embodiment of the disclosure.

Referring to FIG. 4, FIG. 4 is a schematic block diagram of a signal receiving end of a memory storage device according to another exemplary embodiment of the disclosure, which further discloses an internal structure of a clock recovery circuit 412. In the present exemplary embodiment, the clock recovery circuit 412 includes a clock generation circuit 416 and a frequency generation circuit 414. The frequency generation circuit 414 includes a phase-locked loop (PLL) circuit 413 and a reference clock generation circuit 415. In the present exemplary embodiment, the reference clock generation circuit 415 can be a Hartley oscillator, a Colpitts oscillator, a Clapp oscillator, a phase shift oscillator, a resistor-capacitor (RC) oscillator, an inductor-capacitor (LC) oscillator or other oscillators other than a crystal oscillator. The reference clock generation circuit 415 is coupled to the PLL circuit 413. The reference clock generation circuit 415 is configured to generate and output a reference clock CLK_REF to the PLL circuit 413. In the present exemplary embodiment, since the reference clock generation circuit 415 does not have the crystal oscillator, the clock signal CLK provided by the reference clock generation circuit 415 is inaccurate, and is required to be corrected by the frequency comparison circuit 420 according to the data recovery clock CDR_CLK obtained from the input signal IN_DATA by the clock generation circuit 416, so as to produce the more accurate clock signal CLK. In this way, even if the clock recovery circuit 412 does not receive the input signal IN_DATA having the data signal DATA, it can still produce the more accurate clock signal CLK. The PLL circuit 413 is coupled to the frequency comparison circuit 420. The PLL circuit 413 is controlled by the control signal CTRL and generates the clock signal CLK to the clock generation circuit 416 according to the reference clock CLK_REF. The clock generation circuit 416 is coupled to the frequency generation circuit 414. The clock generation circuit 416 performs a clock recovery operation on the input signal IN_DATA according to the clock signal CLK to generate the data recovery clock CDR_CLK. In the present embodiment, in order to implement automatic frequency tracking of the frequency comparison circuit, the clock generation circuit 416 outputs the data recovery clock CDR_CLK to the frequency comparison circuit 420 to serve as a comparison reference.

Therefore, in an exemplary embodiment of the disclosure, the data receiving block 10 receives the input signal IN_DATA, the signal detection circuit 430 detects whether the input signal IN_DATA includes the target signal, for example, whether the input signal DATA includes the data signal DATA with frequency not less than the second frequency. If yes, the signal detection circuit 430 enables the frequency comparison circuit 420 to implement automatic frequency tracking. On the other hand, when the input signal IN_DATA is input, the data signal DATA is transmitted to the clock recovery circuit 412 and the data recovery circuit 118 to respectively generate the data recovery clock CDR_CLK and the data recovery stream CDR_DATA. Moreover, in the disclosure, the clock signal of the PLL circuit 413 is, for example, generated by using an RC oscillator. The clock data recovery circuit module 400 corrects the clock signal CLK of the PLL circuit 413 according to the frequency of the data recovery clock CDR_CLK through the frequency comparison circuit 420. A correction method thereof includes adjusting a multiple of a frequency multiplier in internal of the PLL circuit 413 or an oscillation frequency of the frequency generation circuit 414, such that the PLL circuit 413 may generate a more accurate clock signal CLK. When the data receiving block 10 does not receive the data signal DATA, the clock data recovery circuit module 400 can use the accurate clock signal CLK to serve as a signal for synchronizing frequency.

Figure 5:
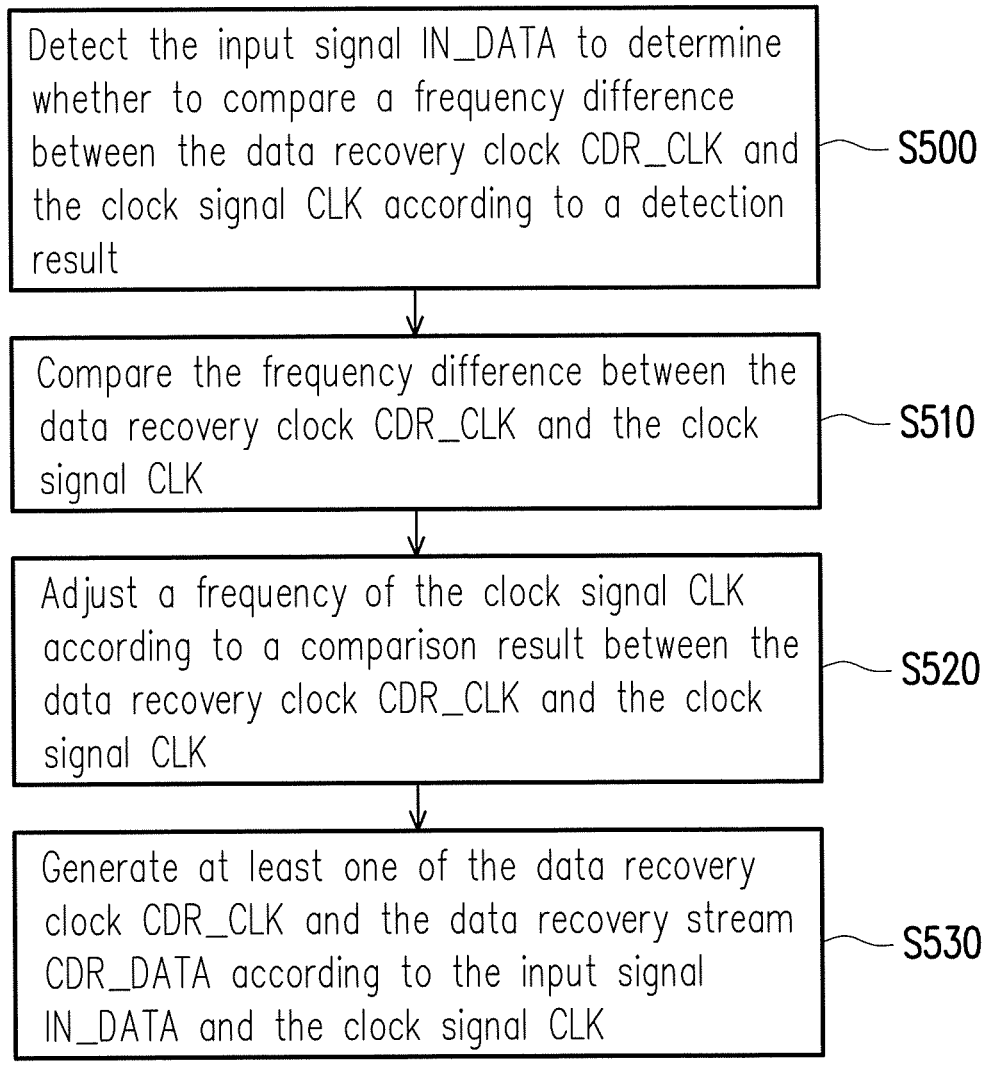
FIG. 5 is a flowchart illustrating a method for generating a data recovery clock according to an exemplary embodiment of the disclosure.

FIG. 5 is a flowchart illustrating a method for generating a data recovery clock according to an exemplary embodiment of the disclosure. Referring to FIG. 1B and FIG. 5, in the present exemplary embodiment, in step S500, the signal detection circuit 130 detects the input signal IN_DATA to determine whether to compare a frequency difference between the data recovery clock CDR_CLK and the clock signal CLK according to a detection result. Then, in step S510, the frequency comparison circuit 120 compares the frequency difference between the data recovery clock CDR_CLK and the clock signal CLK. Then, in step S520, the frequency comparison circuit 120 adjusts a frequency of the clock signal CLK according to a comparison result between the data recovery clock CDR_CLK and the clock signal CLK. Then, in step S530, the clock data recovery circuit 110 generates at least one of the data recovery clock CDR_CLK and the data recovery stream CDR_DATA according to the input signal IN_DATA and the clock signal CLK.

Figure 6:
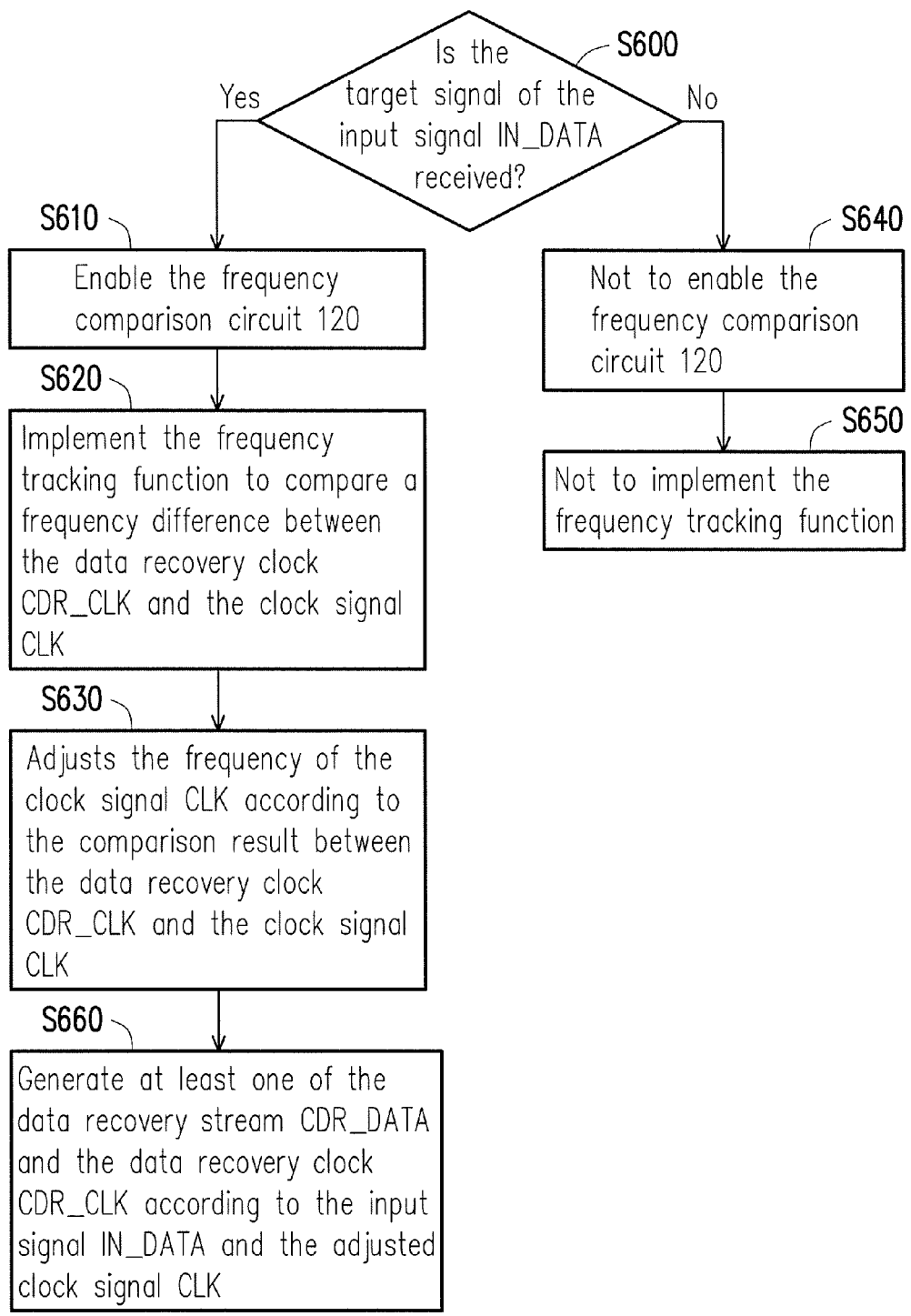
FIG. 6 is a flowchart illustrating a method for generating a data recovery clock according to another exemplary embodiment of the disclosure.

FIG. 6 is a flowchart illustrating a method for generating a data recovery clock according to another exemplary embodiment of the disclosure. Referring to FIG. 1B and FIG. 6, in the present exemplary embodiment, in step S600, the signal detection circuit 130 first detects whether the target signal of the input signal IN_DATA is received. In the present embodiment, the target signal of the input signal IN_DATA is, for example, the second frequency component with higher frequency, i.e. the data signal DATA of FIG. 2 or FIG. 3. If the target signal is detected, in step S610, the signal detection circuit 130 enables the frequency comparison circuit 120. The frequency comparison circuit 120 compares a frequency difference between the data recovery clock CDR_CLK and the clock signal CLK to implement the frequency tracking function, as that shown in step S620. In step S630, the frequency comparison circuit 120 adjusts the frequency of the clock signal CLK according to the comparison result. Then, in step S660, the clock data recovery circuit 110 generates at least one of the data recovery stream CDR_DATA and the data recovery clock CDR_CLK according to the input signal IN_DATA and the adjusted clock signal CLK. In such step, the adjusted clock signal CLK is more accurate compared to the original clock signal CLK before adjustment.

Moreover, in another exemplary embodiment, after the data decoded by the decoder circuit 26 is verified by the verification circuit 140, and the verification circuit 140 determines that error bits of the decoded data recovery stream CDR_DATA exceed a threshold, it can be determined that the data recovery stream CDR_DATA is subjected to a noise interference. Therefore, in order to prevent shifting of the originally tracked stable frequency, the verification circuit 140 pauses the frequency comparison circuit 120 to maintain the original clock signal.

On the other hand, if the signal detection circuit 130 does not detects the target signal of the input signal IN_DATA in the step S600, for example, detects a non-target signal or the electrical idle state, in step S640, the signal detection circuit 130 does not enable the frequency comparison circuit 120, and the frequency comparison circuit 120 stops working and does not perform frequency tracking as that shown in step S650.

Moreover, since those skilled in the art can learn enough instructions and recommendations of the methods for generating the data recovery clocks of the exemplary embodiments of FIG. 5 and FIG. 6 from the descriptions of the embodiments of FIG. 1A to FIG. 4, detailed description thereof is not repeated.

In summary, in the exemplary embodiments of the disclosure, when the signal detection circuit detects the target signal in the input signal, the signal detection circuit enables the frequency comparison circuit to implement the automatic frequency tracking function. Conversely, when the signal detection circuit detects a non-target signal, the signal detection circuit does not enable the frequency comparison circuit to maintain accuracy of the frequency tracking.

The previously described exemplary embodiments of the present invention have many advantages, including dynamically determining whether to perform frequency tracking to maintain accuracy of the frequency tracking, wherein the advantages aforementioned not required in all versions of the invention.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A clock data recovery circuit module, comprising:
    a clock data recovery circuit, configured to output a data recovery stream and a data recovery clock based on an input signal and a clock signal;
    a frequency comparison circuit, coupled to the clock data recovery circuit, wherein the frequency comparison circuit is configured to compare a frequency difference between the data recovery clock and the clock signal to adjust a frequency of the clock signal based on a comparison result; and
    a signal detection circuit, coupled to the frequency comparison circuit and configured to receive and detect the input signal, wherein the signal detection circuit determines whether to enable the frequency comparison circuit according to a detection result, wherein the clock data recovery circuit comprises:
a frequency generation circuit, coupled to the frequency comparison circuit and generating the clock signal according to a reference clock; and
a clock generation circuit, coupled to the frequency generation circuit and generating the data recovery clock according to the input signal and the clock signal, wherein the frequency comparison circuit outputs a control signal according to the comparison result so as to adjust the frequency of the clock signal generated by the frequency generation circuit,
wherein the frequency generation circuit comprises:
a phase-locked loop circuit, coupled to the frequency comparison circuit, wherein the phase-locked loop circuit is controlled by the control signal and generating the clock signal according to the control signal and the reference clock; and
a reference clock generation circuit, coupled to the phase-locked loop circuit and generating and outputting the reference clock.

2. The clock data recovery circuit module as claimed in claim 1, wherein the signal detection circuit comprises:
a first frequency detection unit, receiving and detecting whether the input signal comprises data of a first frequency; and
a second frequency detection unit, receiving and detecting whether the input signal comprises data with frequency not less than a second frequency,
wherein the second frequency is greater than the first frequency.

3. The clock data recovery circuit module as claimed in claim 2, wherein when the signal detection circuit detects that the input signal comprises data with frequency not less than the second frequency, the signal detection circuit enables the frequency comparison circuit.

4. The clock data recovery circuit module as claimed in claim 2, wherein when the signal detection circuit determines that the input signal comprises data of the first frequency, the signal detection circuit does not enable the frequency comparison circuit.

5. The clock data recovery circuit module as claimed in claim 1, wherein when the signal detection circuit determines that the input signal is an electrical idle state signal, the signal detection circuit does not enable the frequency comparison circuit.

6. The clock data recovery circuit module as claimed in claim 1, wherein the clock data recovery circuit comprises:
a data recovery circuit, generating the data recovery stream according to the input signal.

7. The clock data recovery circuit module as claimed in claim 1, wherein the clock data recovery circuit outputs the data recovery stream and the data recovery clock to a data processing block, and the data processing block comprises a buffer circuit and a decoder circuit, wherein the decoder circuit decodes the data recovery stream, the buffer circuit stores the data recovery stream, the frequency comparison circuit is coupled to the buffer circuit, and when the frequency comparison circuit is enabled, the buffer circuit outputs the data recovery stream to the decoder circuit.

8. The clock data recovery circuit module as claimed in claim 7, further comprising:
a verification circuit, coupled to the decoder circuit, verifying the data recovery stream decoded by the decoder circuit, and pausing the operation that the frequency comparison circuit compares the frequency difference between the data recovery clock and the clock signal after determining that error bits of the data recovery stream exceed a threshold.

9. A method for generating a data recovery clock, comprising:
detecting whether an input signal comprises data of a first frequency;
detecting whether the input signal comprises data with frequency not less than a second frequency, wherein the second frequency is greater than the first frequency;
determining whether to compare a frequency difference between a data recovery clock and a clock signal according to a detection result;
comparing the frequency difference between the data recovery clock and the clock signal; and
adjusting a frequency of the clock signal according to a comparison result between the data recovery clock and the clock signal.

10. The method for generating the data recovery clock as claimed in claim 9, further comprising:
generating at least one of the data recovery clock and the data recovery stream according to the input signal and the clock signal.

11. The method for generating the data recovery clock as claimed in claim 9, wherein when it is detected that the input signal comprises data with frequency not less than the second frequency, the step of comparing the frequency difference between the data recovery clock and the clock signal is executed.

12. The method for generating the data recovery clock as claimed in claim 9, wherein when it is detected that the input signal comprises data of the first frequency, the step of comparing the frequency difference between the data recovery clock and the clock signal is not executed.

13. The method for generating the data recovery clock as claimed in claim 9, wherein the input signal comprises an electrical idle state, and the step of detecting the input signal comprises:
detecting whether the input signal is in the electrical idle state,
wherein when the input signal is in the electrical idle state, the step of comparing the frequency difference between the data recovery clock and the clock signal is not executed.

14. The method for generating the data recovery clock as claimed in claim 9, further comprising:
generating the clock signal according to a reference clock, the step of adjusting the frequency of the clock signal comprises:
outputting a control signal according to the comparison result, so as to adjust the frequency of the clock signal.

15. The method for generating the data recovery clock as claimed in claim 10, further comprising:
decoding the data recovery stream; and
verifying the decoded data recovery stream, and pausing comparing the frequency difference between the data recovery clock and the clock signal when error bits of the data recovery stream exceed a threshold.

* * * * *